United States Patent [19]

Ohsawa et al.

[11] Patent Number: 6,020,626
[45] Date of Patent: Feb. 1, 2000

[54] SEMICONDUCTOR DEVICE

[75] Inventors: Kenji Ohsawa; Tomoshi Ohde, both of Kanagawa, Japan

[73] Assignee: Sony Corporation, Tokyo, Japan

[21] Appl. No.: 09/157,155

[22] Filed: Sep. 18, 1998

[30] Foreign Application Priority Data

Sep. 19, 1997 [JP] Japan ................................. 9-254549

[51] Int. Cl.[7] .......................... H01L 23/48; H01L 23/495
[52] U.S. Cl. .......................... 257/668; 257/673; 257/693; 257/738
[58] Field of Search .................................. 257/668, 693, 257/673, 738

[56] References Cited

U.S. PATENT DOCUMENTS

| 5,506,756 | 4/1996 | Haley | 257/693 |
|---|---|---|---|
| 5,656,550 | 8/1997 | Tsuji et al. | 257/786 |
| 5,726,491 | 3/1998 | Tajima et al. | 257/668 |
| 5,729,051 | 3/1998 | Nakamura | 257/697 |
| 5,744,859 | 4/1998 | Ouchida | 257/668 |
| 5,786,271 | 7/1998 | Ohida et al. | 257/778 |

*Primary Examiner*—Tom Thomas
*Assistant Examiner*—Ori Nadav
*Attorney, Agent, or Firm*—Hill & Simpson

[57] ABSTRACT

A semiconductor device is provided which can improve a heat radiation characteristic of the package, and also can solve an uniform characteristic of ball sizes when a projection electrode such as soldering balls is formed by way of the electrolytic plating method. A semiconductor device is comprised of: a semiconductor chip in having a plurality of electrode pads and an inside of a pad forming region thereof used as an effective element region; a reinforcement plate provided under such a condition that this semiconductor chip is surrounded by the reinforcement plate; a plurality of leads constituted by an outer lead and an inner lead, in which a projection electrode is provided on the outer lead, and also a tip portion of the inner lead is connected to the electrode pads sealing resin filled into a peripheral region of the semiconductor chip. A conductor pattern is formed on the effective element region of the semiconductor chip; and the conductor pattern is covered by an insulating film to be protected; and further a projection electrode is provided on this conductor pattern.

4 Claims, 13 Drawing Sheets

SEMICONDUCTOR DEVICE

BACKGROUND OF THE INVENTION

The present invention is related to semiconductor package in which a semiconductor chip is joined with a new lead frame to make up a structure having an ultra-number of pins.

Conventionally, there is such a semiconductor package as shown in FIG. 1, which is capable of being mounted on a printed circuit board and the like via an organic board equipped with a projection electrode such as a soldering ball.

In FIG. 1, a semiconductor chip 51 is mounted on a surface of a multilayer organic wiring board 50 made of approximately 2 to 6 layers by using an organic material. Then, an electrode pad of this semiconductor chip 51 is connected to a wiring film 52 formed on the surface of the multilayer wiring board 50 by way of the wire bonding with employment of a gold line 53 and the like.

A soldering ball (projection electrode) 55 electrically connected via a through hole 54 to the wiring film 52 formed on the front surface of the multilayer organic wiring board 50 is provided on a rear surface of this multilayer organic wiring board 50. This soldering ball 55 is externally exposed through an opening of a solder resist film 56. Also, the semiconductor chip 51 is sealed together with the gold line 53 by employing sealing resin 57.

In the semiconductor package 58 with the above-described structure, the soldering ball 55 formed on the rear surface is connected to a printed circuit board 59. Generally speaking, since a large number of soldering balls 55 are arranged in a grid shape on the multilayer organic wiring board 50, this multilayer organic wiring board 50 may be referred to as a "ball grid array (BGA)", and also the semiconductor package 58 with employment of this multilayer organic wiring board 50 may be referred to as "BGA package".

However, in the above-described conventional semiconductor package 58, since the electrode pad of the semiconductor chip 51 is connected to the wiring film 52 of the multilayer organic wiring board 50 by employing wire bonding, there is a limitation when the wiring pitch is reduced. Also, for example, even in another semiconductor package called a TCP (tape carrier package) other than this BGA package, since a copper foil adhered to an insulating film base is etched away to form a lead, there is another limitation caused by narrowing the lead due to side etching. As a consequence, it is practically difficult to manufacture the TCP package with a large number of pins.

Accordingly, the applicant has proposed such semiconductor package made of the structure having ultra-number of pins by joining the novel lead frame to the semiconductor chip.

FIG. 2 is a cross-sectional view for representing an example of the semiconductor package made of the structure having an ultra-number of pins.

In the structure of the semiconductor package 60 shown in this drawing, a plurality of electrode pads 62 are formed around a peripheral portion of a surface (namely, lower surface of semiconductor chip in FIG. 2) of a semiconductor chip 61. Also, a reinforcement plate 63 is provided outside the semiconductor chip 61 under such a condition that this semiconductor chip 61 is surrounded by the reinforcement plate 63. A wiring film 65 is stacked via an insulating adhesive layer 64 on the reinforcement plate 63. This wiring film 65 is constituted by a plurality of leads 66 and an insulating film 67. The plural leads 66 are made of an inner lead 66a and an outer lead 66b. The insulating film 67 is used to cover and protect the outer lead 66b. A tip portion of the inner lead 66a is connected to the electrode pad 62 formed on the surface of the semiconductor chip, and further a soldering ball (projection electrode) 68 is formed via the insulating film 67 on the outer lead 66b. Also, sealing resin 69 is filled into the peripheral region of the semiconductor chip 61, and furthermore, a heat radiation plate 71 is joined via a heat conductive adhesive agent 70 to both the rear surface of the semiconductor chip 61 and the reinforcement plate 63.

Now, a brief description will be made of manufacturing steps for the above-described semiconductor package 60.

First, as indicated in FIG. 3A, when the lead frame is manufactured, a metal base 72 having a 3-layer structure is prepared. This metal base 72 is formed in such a manner that an aluminum film 74 is formed on a surface of a board made of either copper or a copper alloy (will be referred to as a "copper board" hereinafter), and then a nickel film 75 is formed on this aluminum film 74. Next, as shown in FIG. 3B, a plurality of leads 66 are formed on the surface of the metal base 72 by way of electrolytic copper plating. Then, as shown in FIG. 3C, a slit 76 is formed so as to define an outer shape of the lead frame with respect to each of chips. Subsequently, as indicated in FIG. 3D, the insulating film 67 is stacked on the leads 66, so that the wiring film 65 constructed of the plural leads 66 and the insulating film 67 is fabricated. At this time, a lead portion projected from the insulating film 67 becomes the inner lead 66a, and another lead portion which is covered/protected by the insulating film 67 becomes the outer lead 66b. Thereafter, as shown in FIG. 3E, an underlayer film made of nickel is formed on the outer lead 66b covered by the insulating film 67, and then a soldering material 68a is stacked on this underlayer film by way of the electrolytic plating. At this time, the soldering material 68a is formed as a mushroom shape.

Next, as represented in FIG. 4A and FIG. 4B, the copper board 73 of the metal base 72, the aluminum film 74, and the nickel film 75 are sequentially removed by way of the selective etching while an outer ring 77 is left. As a result, the respective leads 66 may be separated from each other. Next, as shown in FIG. 4C, the reinforcement plate 63 is joined via the insulating adhesive layer 64 to the surface of the outer lead 66b covered by the insulating film 67. Next, as indicated in FIG. 4D, a bump 78 is formed on a tip portion of each of the inner leads 66a extended from the insulating film 67.

The lead frame 79 before the semiconductor chip is assembled is completed by the above-described manufacturing steps.

Thereafter, when the semiconductor chip is assembled to the above-described lead frame 79, as represented in FIG. 5A, the tip portion of the inner lead 66a is connected via the bump 78 to the electrode pad 62 of the semiconductor chip 61. Next, as shown in FIG. 5B, the sealing resin 69 is filled into the peripheral region of the semiconductor chip 61 to be hardened. Next, as illustrated in FIG. 5C, the heat radiation plate 71 is joined via the heat conductive adhesive agent 70 to the rear surface of the semiconductor chip 61 and the reinforcement plate 63. Thereafter, as shown in FIG. 5D, the soldering material 68a which has been stacked by way of the electrolytic plating in the preceding steps for manufacturing the lead frame is formed by the reflow process to obtain a desirable soldering ball 68. Finally, as illustrated in FIG. 5E, the outer shape ring 77 is cut out, while setting an outer peripheral portion of the reinforcement plate 63 as a boundary, so that the semiconductor package 60 shown in FIG. 2 may be accomplished.

In this semiconductor package 60, since the leads 66 are formed on the metal base 72 by way of the electrolytic plating in the manufacturing steps of the lead frame 79, these leads can be made with the fine pattern. Therefore, the semiconductor package 60 with the structure having ultra-number of pins can be realized without being adversely influenced by the restrictions in the conventional semiconductor package. Also, since the heat radiation plate 71 is joined to the rear surface of the chip, the superior heat radiation characteristic can be achieved.

However, even in the above-described semiconductor package 60 with the structure having ultra-number of pins, there are the following difficulties:

(1) Although the heat radiation plate 71 capable of radiating heat energy is provided on the rear surface side of the semiconductor chip 61, there is a risk that sufficient heat radiation characteristics could not be achieved, assuming that the heat radiation amount of the semiconductor chip 61 is increased in connection with, for instance, an increase in operation speeds of CPUs in a future stage.

(2) In the case that the soldering ball 68 is formed by way of the electrolytic plating method, the inner peripheral array of the soldering ball 68 is made slightly large because of the uniform current distribution on the outer side of the chip. In the worst case, there is another risk that the size of the soldering ball is deviated from the ruled size.

The present invention has been made to solve the above-described problems, and therefore, has an object to provide such a semiconductor package comprising: a semiconductor chip in which a plurality of electrode pads are formed on a peripheral portion of a surface of the semiconductor chip, and an inside of a pad forming region thereof is used as an effective element region; a reinforcement plate provided under such a condition that this semiconductor chip is surrounded by the reinforcement plate; a plurality of leads constituted by an outer lead which is covered by an insulating film to be protected on this reinforcement plate, and an inner lead which is extended from this outer lead in an integral form, in which a projection electrode is provided on the outer lead and a tip portion of the inner lead is connected to the electrode pad of the semiconductor chip; and sealing resin filled into a peripheral region of the semiconductor chip wherein a conductor pattern is formed on the effective element region of the semiconductor chip; and the conductor pattern is covered by an insulating film to be protected; and further a projection electrode is provided on this conductor pattern.

In the semiconductor package with the above-described structure, the conductor pattern is formed on the effective element region of the semiconductor chip, and the projection electrodes are formed on this conductor pattern. As a consequence, when the semiconductor package is mounted on the packaging board, heat produced from the semiconductor a chip can be directly dissipated via the projection electrodes to the packaging board. Also, since the projection electrodes are provided on the reinforcement plate and the semiconductor chip, when the projection electrodes such as the soldering balls are formed by way of the electrolytic plating method, the fluctuation in the sizes of the soldering balls can be suppressed. Accordingly, the uniformed size of the balls can be realized.

BRIEF DESCRIPTION OF THE DRAWINGS

For a better understanding of the present invention, reference is made of a detailed description to be read in conjunction with the accompanying drawings, in which.

DETAILED DESCRIPTION OF THE DRAWINGS

Referring now to drawings, embodiment modes of the present invention will be described in detail.

Figure 6:
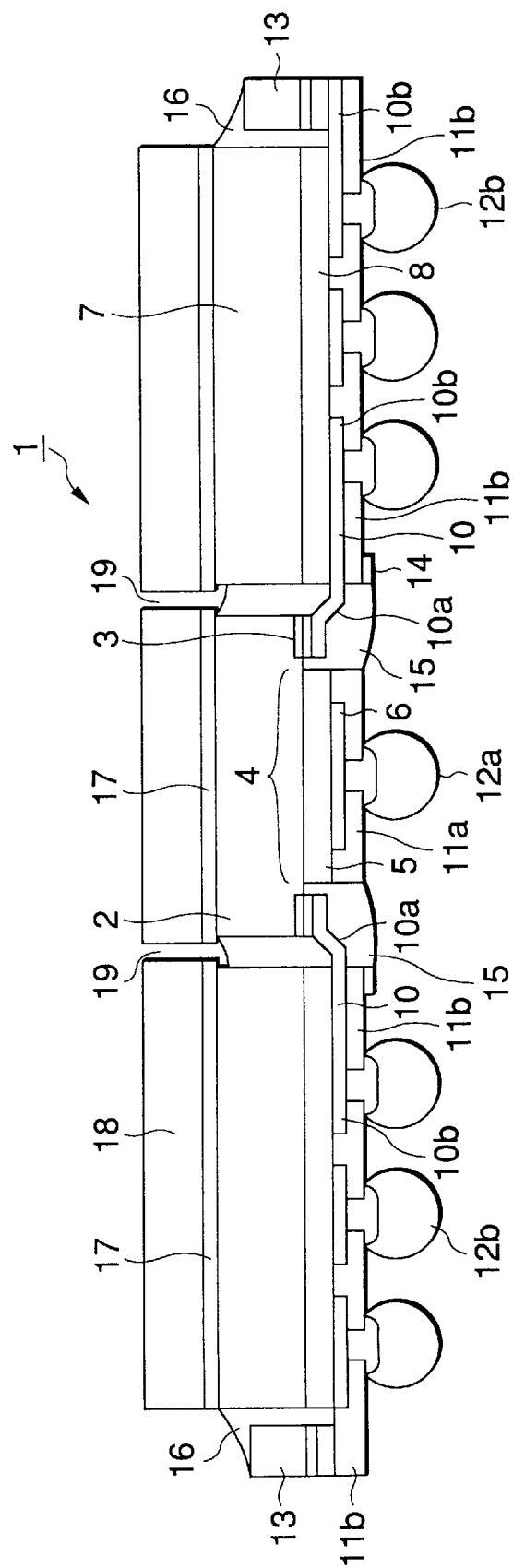
FIG. 6 is a cross-sectional view for showing semiconductor package according to a first embodiment of the present invention.

FIG. 6 is a cross-sectional view for showing semiconductor package according to a first embodiment of the present invention.

In the structure of the semiconductor package 1 shown in the drawing, a plurality of electrode pads 3 are formed over a peripheral portion of a surface of a semiconductor chip 2 (namely, a lower surface of the semiconductor chip in FIG. 6), and an inside of a region for forming these pads constitutes an effective element region 4. Also, as a feature portion of this first embodiment mode, a conductor pattern 6 made of, e.g., copper is formed via an adhesive layer 5 used to join the semiconductor chip on the effective element region 4 of the semiconductor chip 2. This conductor pattern 6 is covered/protected by an insulating film 11a, and a projection electrode 12a constructed of a soldering ball and the like is formed via this insulating film 11a on the conductor pattern 6.

On the other hand, a reinforcement plate 7 is provided outside the semiconductor chip 2 under such a condition that this semiconductor chip 2 is surrounded by this reinforcement plate 7. A plurality of leads 10 are formed via an insulating adhesive layer 8 on this reinforcement plate 7. Each of these leads 10 is constituted by an inner lead 10a and an outer lead 10b. Among these leads, the inner lead 10a is extended in an integral body from the outer lead 10b, and a tip portion of this lead is connected to the electrode pad 3 of the semiconductor chip 2. The outer lead 10b is covered and protected by the insulating film 11b, and another projection electrode 12b made of a soldering ball and the like is provided via the insulating film 11b on the outer lead 10b.

Also, a conductive outer shape ring 13 is provided outside the reinforcement plate 7 under such a condition that this reinforcement plate 7 is surrounded by the conductive outer shape ring 13. At least, any one of the above-described plural outer leads 10b is extended over this outer shape ring 13, and an electrical connection condition can be established between both the outer shape ring and the outer lead at the extended portion. Then, in a peripheral region of the semiconductor chip 2, sealing resin 15 is filled, while using a reinforcement tape 14 adhered onto the insulating film 11 as a bank. Furthermore, conductor paste 16 is filled into a space defined between the outer shape ring 13 and the reinforcement plate 7 provided at the outermost peripheral portion of the package. In addition, a heat radiation plate 18 is joined via a heat conductive adhesive agent 17 to a rear surface of the semiconductor chip 2 (namely, an upper surface of the semiconductor chip in FIG. 6), and also the reinforcement plate 7. Also, a gas discharge hole 19 communicated with the filling region of the above-explained sealing resin 15 is formed in a central portion of the heat radiation plate 18.

Subsequently, a manufacturing sequence of the semiconductor package 1 constituted by the above-described structure will now be made with reference to drawings.

Figure 7A:
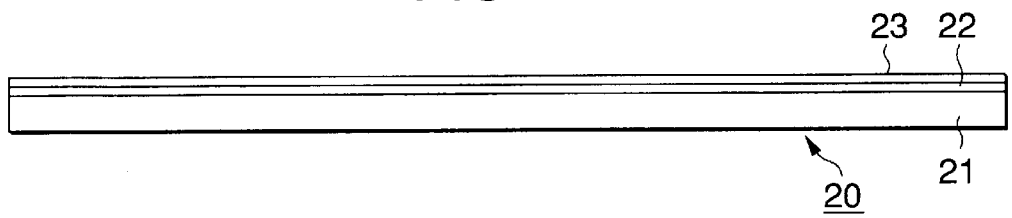
FIG. 7 is a manufacturing step diagram (No. 1) of the semiconductor package according to the first embodiment.

First, as indicated in FIG. 7A, when a lead frame is manufactured, a metal base 20 is prepared which is made of a metal base 20 is manufactured in such a manner that an aluminum film 22 having a thickness of on the order of 3 μm is formed on a surface of a board 21 made of either copper or a copper alloy (will be referred to as a "copper board" hereinafter) and having a thickness of on the order of 150 μm by way of, for example, a vapor deposition, and furthermore, a nickel film 23 having a thickness of on the order of 2 μm is formed.

Among these members, the copper board 21 itself does not constitute the lead, and will be finally cut out except for an outer shape ring portion (will be discussed later). However, this copper board 21 is necessarily required to form a very fine lead pattern. The aluminum film 22 may correspond to an etching stop film. This etching stop film is not to etch away the front surface side of the metal base 20 when the copper board 21 is etched away in the subsequent stage. The nickel film 23 may correspond to an underlayer of electrolytic plating used to form the lead on the surface of the metal base 20, namely a plating underlayer film.

It should be understood that as to the metal base 20, for instance, a chrome film having a thickness of on the order of 0.5 μm may be formed as a close-fitting film between the aluminum film 22 and the nickel film 23 in order to emphasize the close-fitting characteristic between these aluminum and nickel films. Alternatively, a copper thin film may be formed as the plating underlayer film instead of the nickel film 23.

Figure 7B:
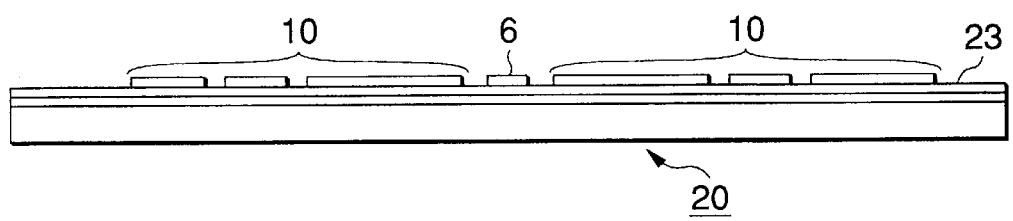

Next, as indicated in FIG. 7B, a plurality of leads 10 made of copper having a thickness of on the order of 30 μm are formed in a pattern shape by way of the selective plating method on the surface of the metal base 20, namely the surface of the nickel film 23. At this time, similar to the above-described manufacturing step, the conductor pattern 6 is formed on a portion corresponding to a region (namely, junction region) used to assemble a semiconductor chip. This conductor pattern 6 may be pattern-formed in a lead shape, or may be formed in a set-solid pattern. At least, any one of the above-explained plural leads 10 is formed under such a condition that this one lead 10 is extended up to an outer shape ring portion (will be discussed later). In this selective plating step, the surface of the metal base 20 is selectively covered by the resist pattern, and the electrolytic copper plating is carried out while this resist pattern is used as a mask. As a result, it is possible to manufacture such a lead 10 in a fine pattern and having a better film quality.

Figure 7C:
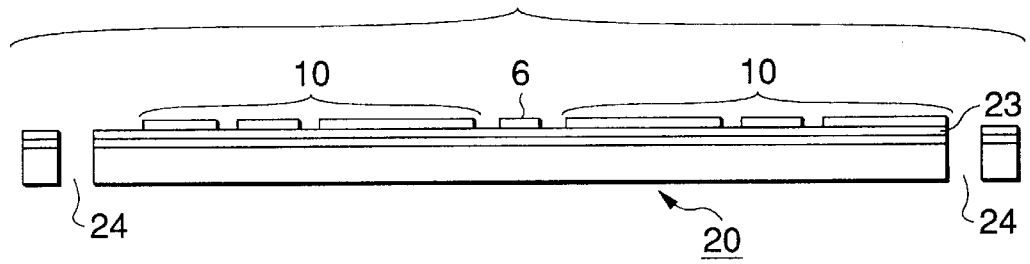

Next, as indicated in FIG. 7C, both surfaces of the metal base 20 is selectively etched away, so that a slit 24 capable of defining the outer shape of the leads frame every semiconductor chip, and a hole (not shown) used to easily carry out the manufacturing steps are formed.

Figure 7D:
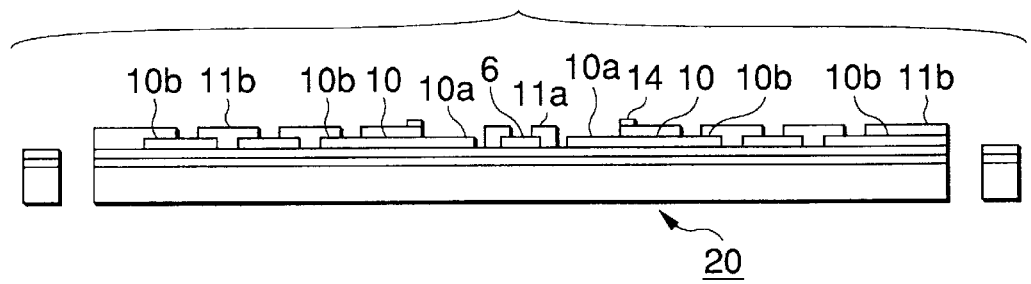

Next, as shown in FIG. 7D, among a plurality of leads 10 formed by way of the selective plating method, the insulating film 11b made of, for example, a polyimide film having a thickness of approximately 25 μm is stacked on lead portions which constitute the outer lead 10b. Thereafter, a predetermined portion of this insulating film 11b is opened by way of the etching treatment. At this time, a lead portion projected from the insulating film 11 (reinforcement tape 14) corresponds to the inner lead 10a. At the same time, an insulating film 11a such as a polyimide film is stacked also on the above-described conductor pattern 6, and then a preselected portion thereof is opened. Furthermore, a ring-shaped reinforcement tape 14 is adhered on the insulating film 11b.

Figure 7E:
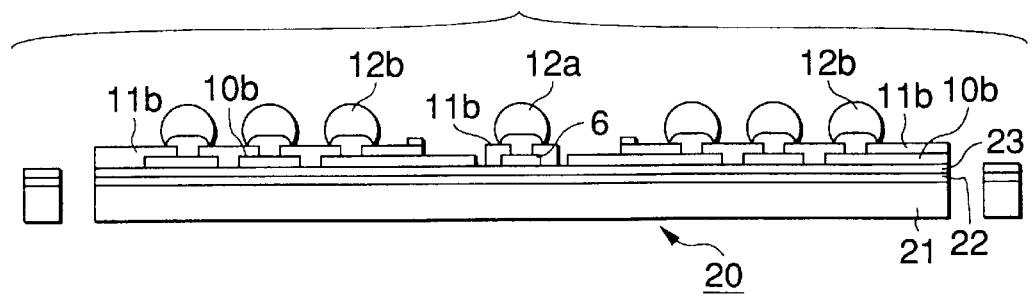

Next, as indicated in FIG. 7E, projection electrodes 12a and 12b made of, for example, soldering balls are formed on the outer lead 10b and the conductor pattern 6, which are covered and protected by the insulating films 11a and 11b, while using these insulating films 11a and 11b as masks.

These projection electrodes 12a and 12b are formed in such a manner that after nickel having a thickness of on the order of 110 μm has been formed as an underlayer film on the outer lead 10b and the conductor pattern 6, which are exposed over the insulating films 11a and 11b, by way of, for example, the electrolytic plating method, a soldering material made of a tin-lead alloy having a thickness of on the order of 230 μm is stacked on this underlayer film by way of the electrolytic plating method, and then this soldering material is reflow-processed to be formed in a ball shape.

Figure 8A:
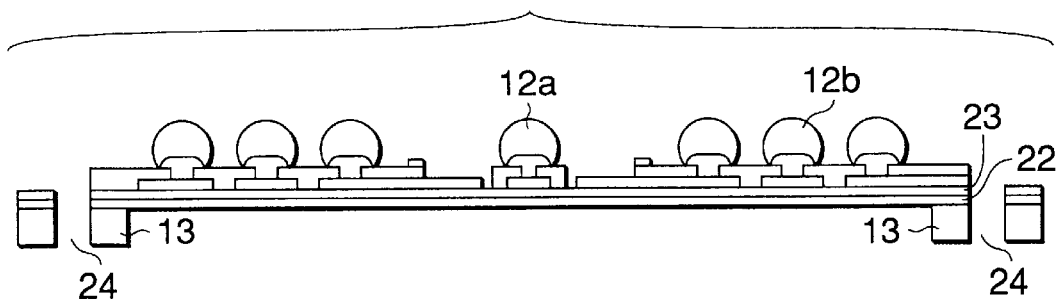
FIG. 8 is a manufacturing step diagram (No. 2) of the semiconductor package according to the first embodiment.

Subsequently, as shown in FIG. 8A, the copper board 21 of the metal base 20 is removed by way of the selective etching method while leaving a portion of the outer shape ring 13 inside the slit 24. When this selective etching method is carried out, the aluminum film 22 may function as an etching stopper, and thus only the copper board 21 is removed.

Figure 8B:
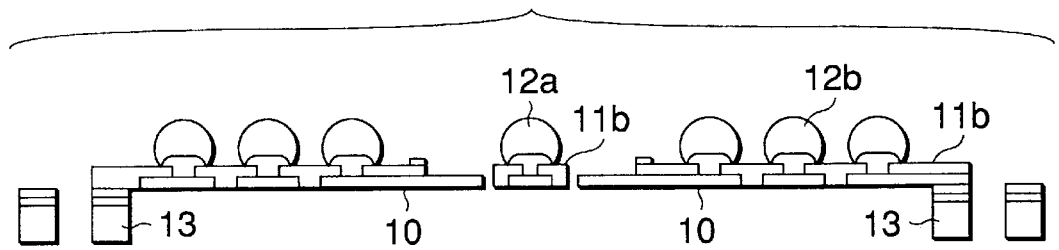

Next, as indicated in FIG. 8B, after the aluminum film 22 of the metal base 20 is removed by way of the selective etching method, the nickel film 23 is further removed by way of the selective etching method, so that the respective leads 10 are isolated from each other. It should be noted that under the condition shown in FIG. 8B, this condition represents that the insulating film 11b provided on the outer side is separated from the insulating film 11a provided on the inner side. In an actual case, both the insulting film 11a and the insulating film 11b are coupled to each other by employing a suspend portion (not shown) formed in an integral body.

Figure 8C:
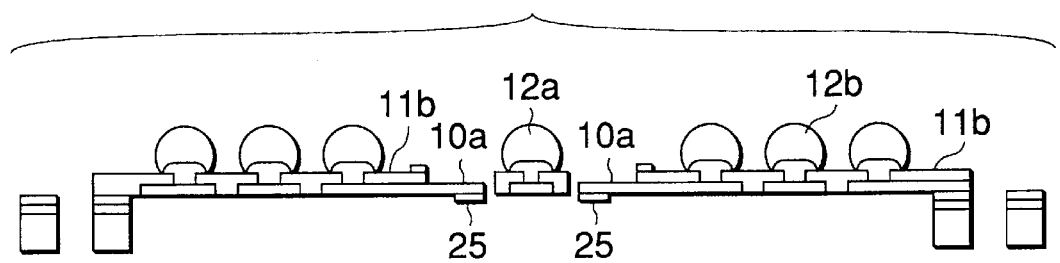

Next, as represented in FIG. 8C, a bump 25 made of aluminum by way of, for example, either the sputtering method or the vapor deposition method is formed on a tip portion of each of the inner leads 10a extended from the insulating film 11b.

Figure 8D:
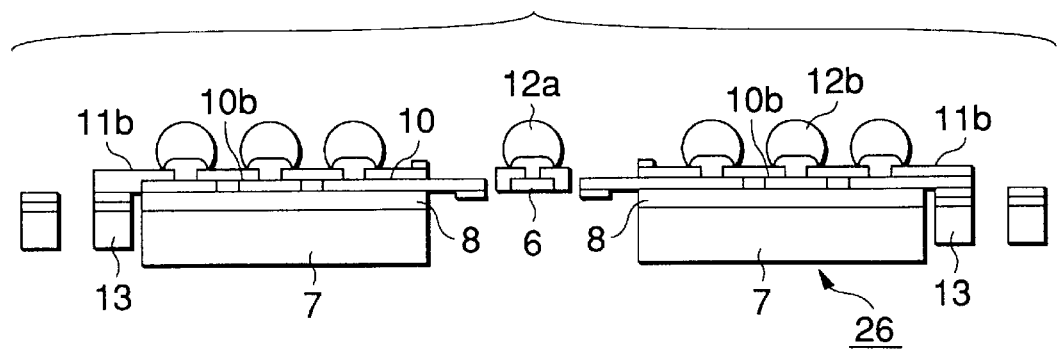

Thereafter, as shown in FIG. 8D, the reinforcement plate 7 is joined via the insulating adhesive layer 8 to the surface of the outer lead 10b protected by the insulating film 11b. When this reinforcement plate 7 is joined, as explained above, the inner peripheral portion of the outer shape ring 13 formed by way of the selective etching method may be utilized as the positioning reference.

Thus, the lead frame 26 before the semiconductor chip is assembled thereon is accomplished with employment of the above-described manner.

Figure 9A:
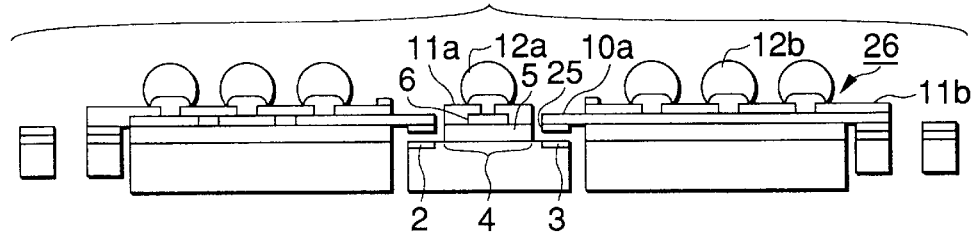
FIG. 9 is a manufacturing step diagram (No. 3) of the semiconductor package according to the first embodiment.

Subsequently, as indicated in FIG. 9A, when the semiconductor chip is assembled, while the position operation is carried out between the lead frame 26 and the semiconductor chip 2, the semiconductor chip 2 is joined (dye-bonded) via the adhesive layer 5 to the insulating film 11a provided at the chip bonding region thereof. As a result, such a condition is made up. That is, the conductor pattern 6 is formed via the adhesive layer 5 on the effective element region 4 of the semiconductor chip 2, and the insulating film 11a is stacked on this conductor pattern 6. Also, the tip portions (bumps 25) of the inner leads 10a are positioned-opposite to the corresponding electrode pads 3 of the semiconductor chip 2, respectively.

Figure 9B:
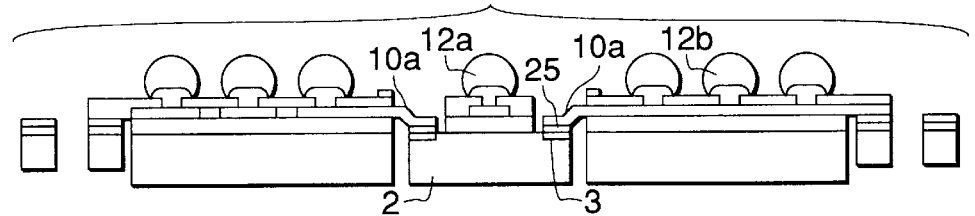

Next, as indicated in FIG. 9B, the tip portions of the respective inner leads 10a are connected via the bumps 25 to the electrode pads 3 of the semiconductor chip 2 by way of the single point bonding.

Figure 2:
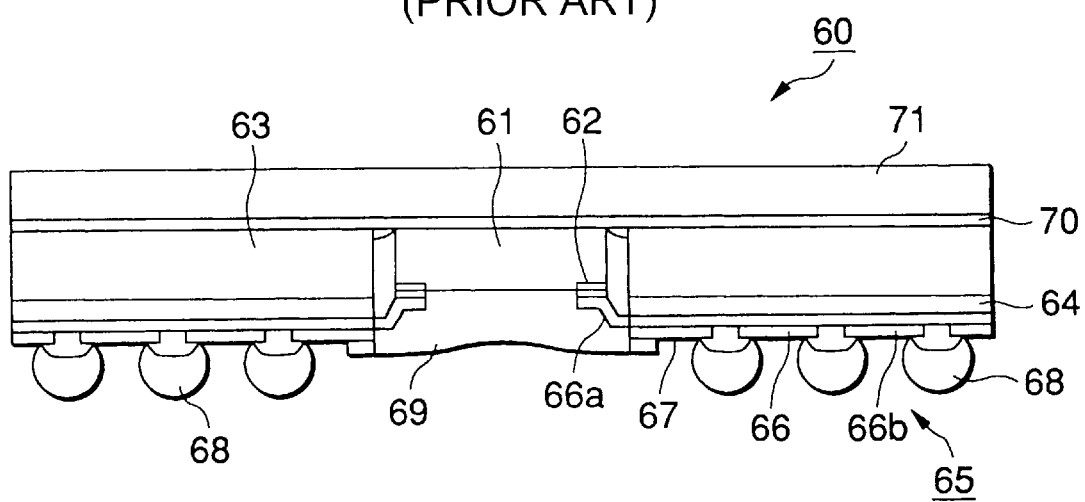
FIG. 2 is a cross-sectional view for showing one example of the semiconductor package with the structure having ultra-number of pins.
Figure 3A:
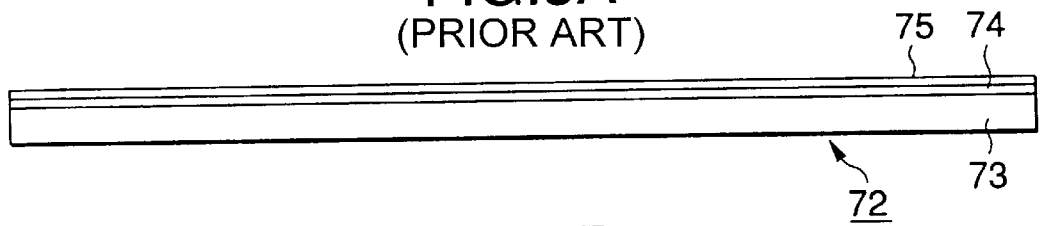
FIG. 3 is a manufacturing step diagram (No. 1) of the semiconductor package for the structure having ultra-number of pins.
Figure 3B:
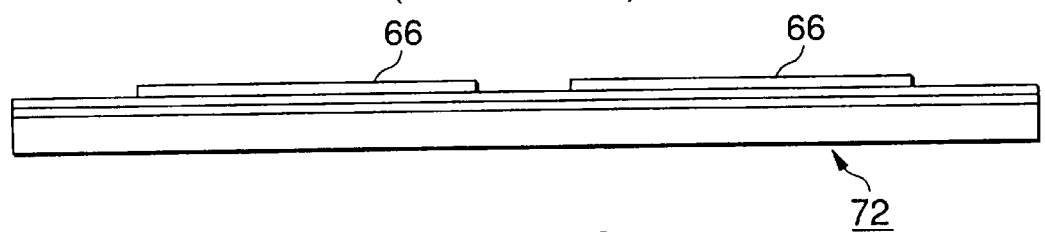
Figure 3C:
Figure 3D:
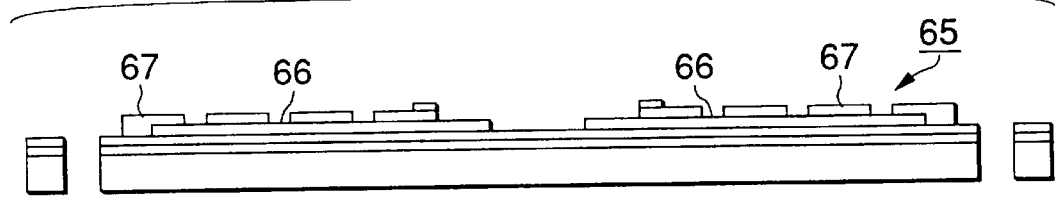
Figure 3E:
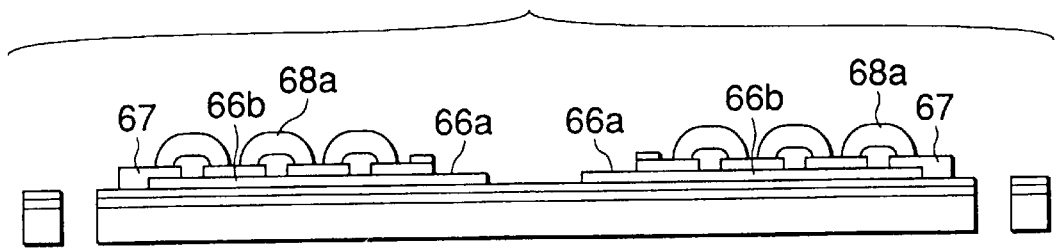
Figure 4A:
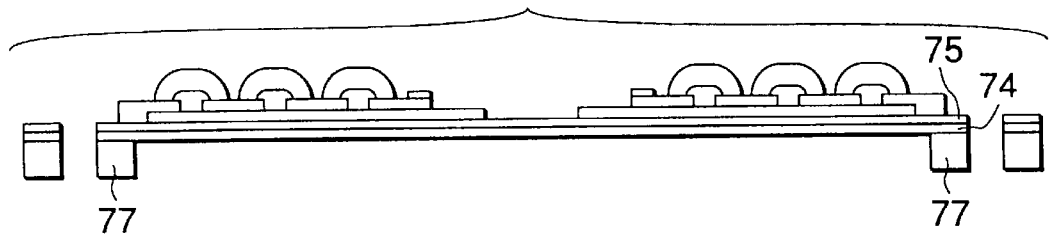
FIG. 4 is a manufacturing step diagram (No. 2) of the semiconductor package for the structure having ultra-number of pins.
Figure 4B:
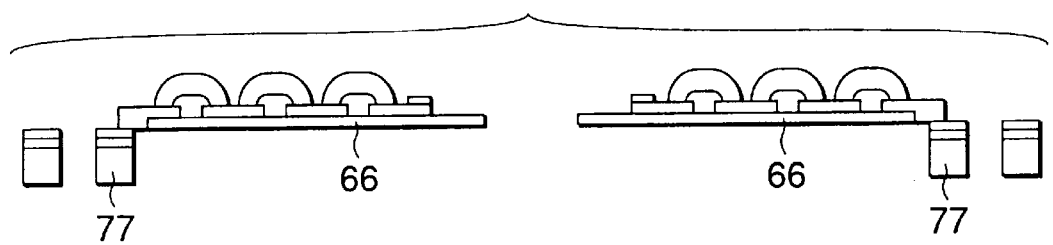
Figure 4C:
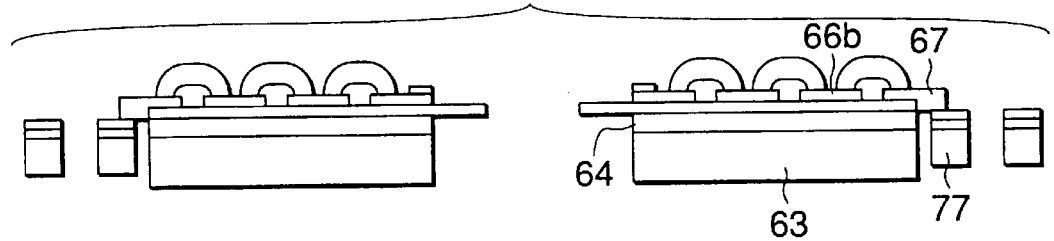
Figure 4D:
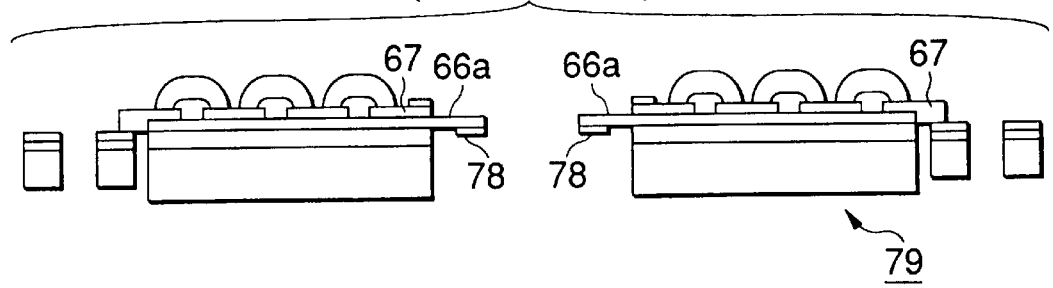
Figure 5A:
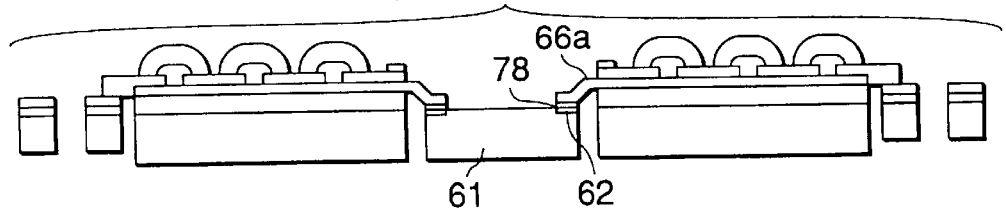
FIG. 5 is a manufacturing step diagram (No. 3) of the semiconductor package for the structure having ultra-number of pins.
Figure 5B:
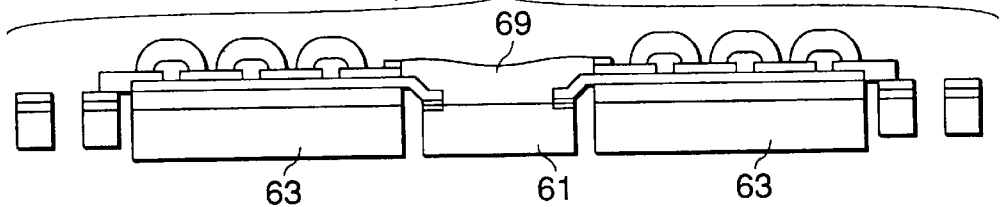
Figure 5C:
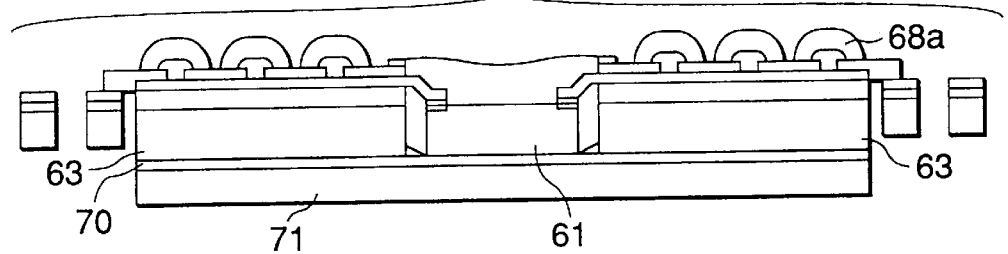
Figure 5D:
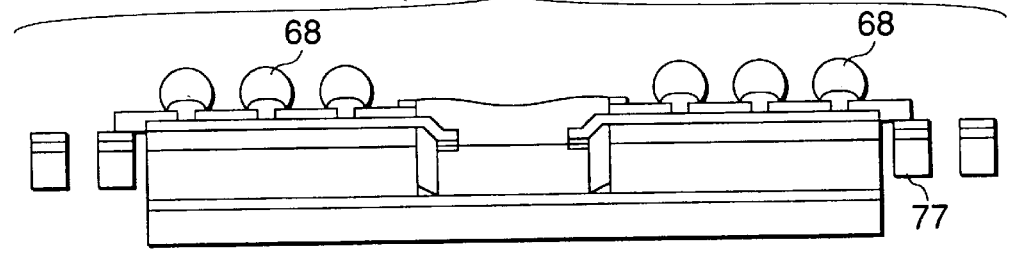
Figure 5E:
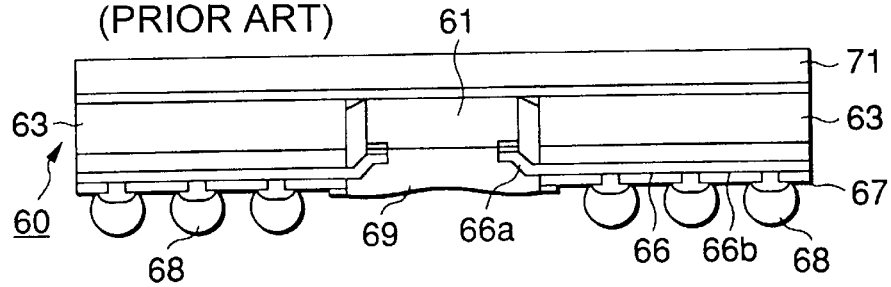
Figure 9C:
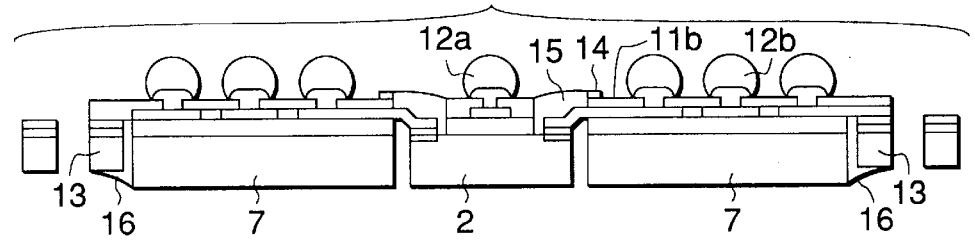

Next, as shown in FIG. 9C, the sealing resin 15 such as epoxy resin and silicone resin is injected into the peripheral region of the semiconductor chip 2 by way of the potting method, and then this sealing resin 15 is hardened, so that the peripheral components are made in an integral form. At this time, the reinforcement tape 14 adhered on the insulating film 11b may function as a bank for stopping the resin. When this sealing resin is injected, since both the adhesive layer 5 and the insulting film 11a are stacked on the effective element region 4 of the semiconductor chip 2, the resin injection time can be shortened, as compared with that of the previously explained package structure shown in FIG. 2. Thereafter, the conductor paste 16 such as silver paste and copper paste is filled into the space between the reinforcement plate 7 and the outer shape ring 13, and then this conductor paste is hardened so as to make both the reinforcement plate 7 and the outer shape ring 13 is an integral form.

Figure 9D:
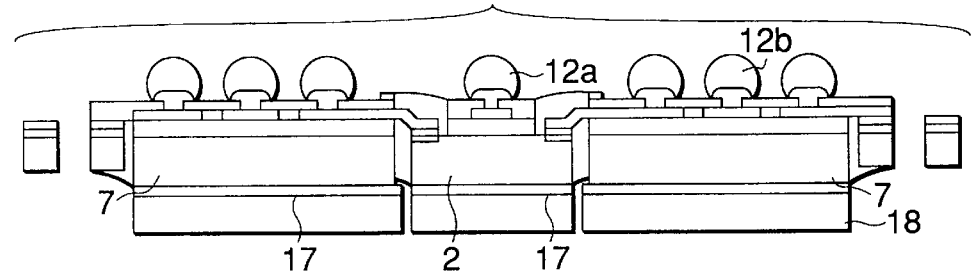

Next, as illustrated in FIG. 9D, the heat radiation plate 18 is joined via the heat conductive adhesive agent 17 to both the rear surface of the semiconductor chip 2 and the reinforcement plate 7.

Figure 9E:
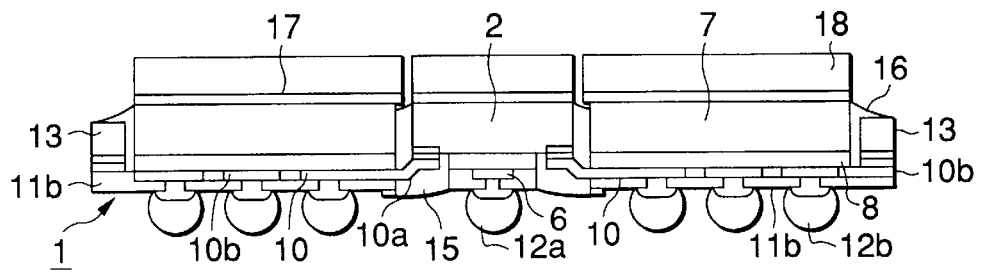

Then, finally, as shown in FIG. 9E, unnecessary portions are cut out while setting the outer peripheral edge of the outer shape ring 13 as the boundary, so that the semiconductor package 1 indicated in FIG. 6 can be completed.

In accordance with the semiconductor package 1 of this first embodiment mode, since the conductor pattern 6 is formed on the effective element region 4 of the semiconductor chip 2 and the projection electrode 12a is formed via the insulating film 11a on this conductor pattern 6, when the semiconductor package 1 is mounted on a packaging board (not shown), heat produced from the semiconductor chip 2 can be directly radiated via the projection electrode 12a to the packaging board. While the projection electrode such as the soldering ball is formed by way of the electrolytic plating method, since the projection electrode 12a is newly added on the semiconductor chip 2, the current distribution when the electrolytic plating operation is performed is uniformed. As a consequence, it is possible to suppress the fluctuations in the sizes of the soldering balls.

Figure 10:
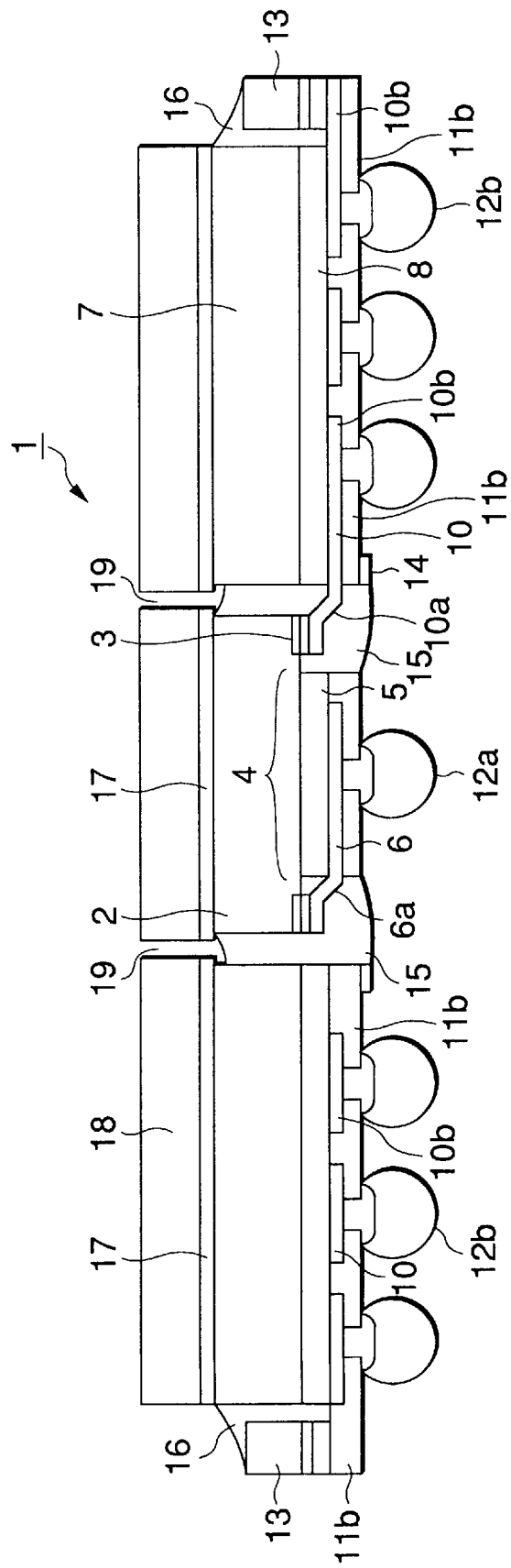
FIG. 10 is a cross-sectional view for showing semiconductor package according to a second embodiment of the present invention.

FIG. 10 is a cross-sectional view for indicating semiconductor package according to a second embodiment of the present invention.

It should be noted that the same reference numerals shown in the above-explained first embodiment mode will be employed as those for denoting the same, or similar structural elements in this second embodiment mode.

In the structure of the semiconductor package 1 shown in this drawing, in particular, the shape of the conductor pattern 6 formed on the effective element region 4 of the semiconductor chip 2 is different from that of the package structure according to the first embodiment mode.

That is, similar to a plurality of leads 10 formed on the reinforcement plate 7, in accordance with the structure of this second embodiment mode, the conductor pattern 6 is formed in a lead shape, and a tip portion side 6a of this lead-shaped pattern is projected from the insulating film 11a. Then, the tip portion of the pattern 6a projected from the insulating film 11a is connected to the electrode pad 3 of the semiconductor chip 2 similar to the inner lead 10a.

Subsequently, a manufacturing sequence of the semiconductor package 1 constituted by the above-described structure will now be made with reference to drawings.

Figure 11A:
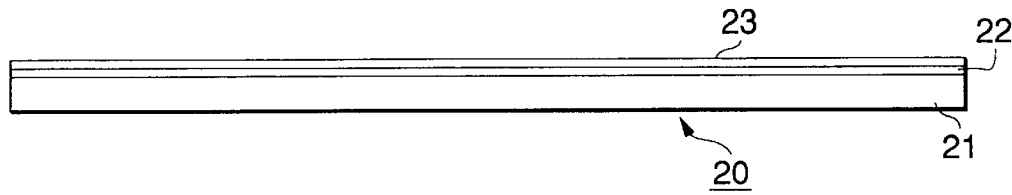
FIG. 11 is a manufacturing step diagram (No. 1) of the semiconductor package according to the second embodiment.

First, as indicated in FIG. 11A, when a lead frame is manufactured, a metal base 20 is prepared which is made of a stacked layer plate having a three-layer structure. This metal base 20 is manufactured in such a manner that an aluminum film 22 having a thickness of on the order of 3 µm is formed on a surface of a copper board 21 having a thickness of on the order of 150 µm by way of, for example, a vapor deposition, and furthermore, a nickel film 23 having a thickness of on the order of 2 µm is formed in a similar manner to the above-described first embodiment mode.

Figure 11B:
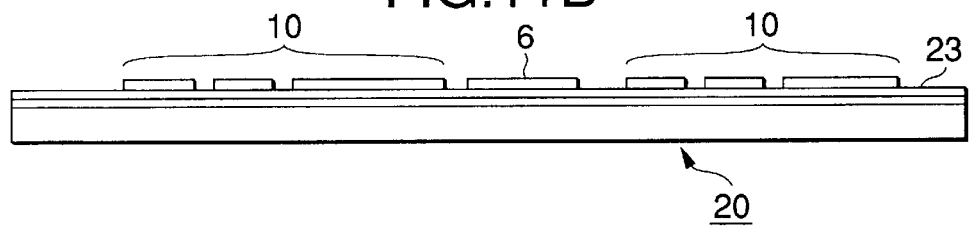
Figure 11C:
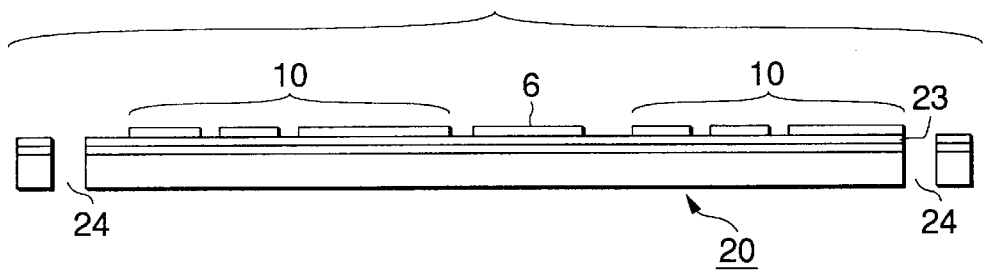
Figure 11D:
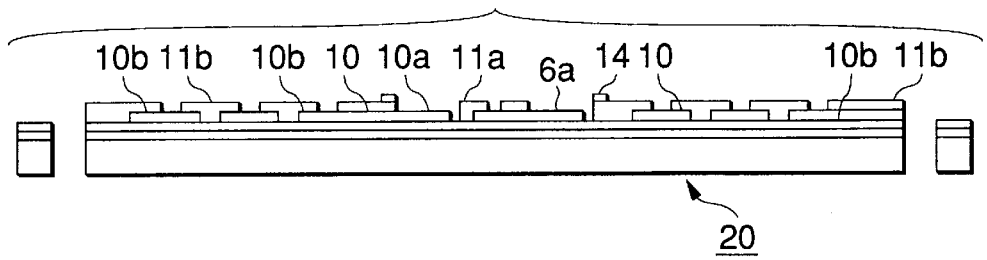
Figure 11E:
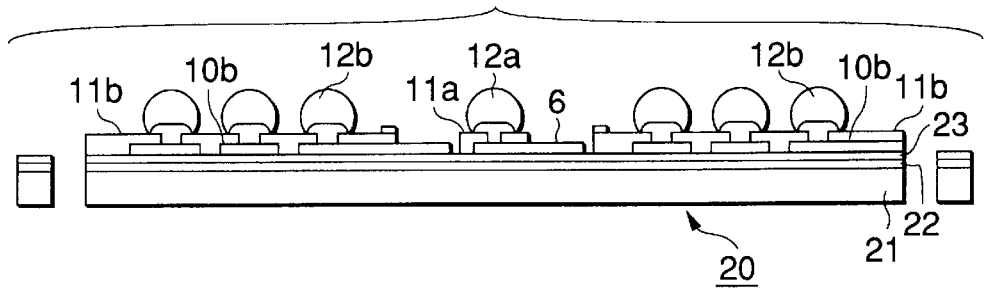

Next, as indicated in FIG. 11B, a plurality of leads 10 made of copper having a thickness of on the order of 30 µm are formed in a pattern shape by way of the selective plating method on the surface of the metal base 20, namely the surface of the nickel film 23. At this time, the conductor pattern 6 is formed on a portion corresponding to a region (namely, junction region) used to assemble a semiconductor chip. This conductor pattern 6 may be pattern-formed in a lead shape. Then, a tip portion of this lead-shaped pattern is formed in such a manner that this tip portion is extended up to a position corresponding to the electrode pad on the semiconductor chip.

Figure 1:
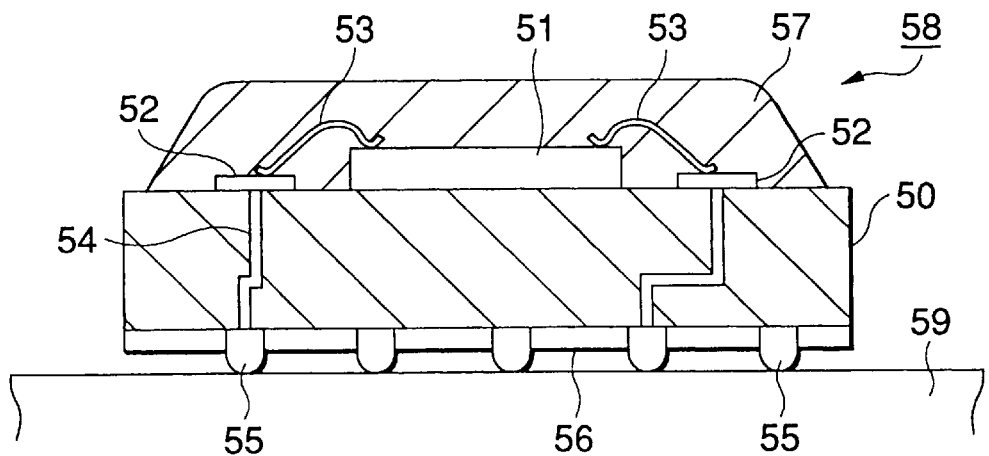
FIG. 1 is a cross-sectional view for representing the BGA package.

Next, as indicated in FIG. 1C, both surfaces of the metal base 20 is selectively etched away, so that a slit 24 capable of defining the outer shape of the leads frame every semiconductor chip, and a hole (not shown) used to easily carry out the manufacturing steps are formed.

Next, as shown in FIG. 1D, among a plurality of leads 10 formed by way of the selective plating method, the insulating film 11b made of a polyimide film is stacked on lead portions which constitute the outer lead 10b. Thereafter, a predetermined portion of this insulating film 11b is opened by way of the etching treatment. At this time, a lead portion projected from the insulating film 11 (reinforcement tape 14) corresponds to the inner lead 10a. At the same time, an insulating film 11a such as a polyimide film is stacked also on the above-described conductor pattern 6, and then a preselected portion thereof is opened. At this time, a portion 6a of the conductor pattern 6 is projected from the insulating film 11a. Furthermore, a ring-shaped reinforcement tape 14 is adhered on the insulating film 11b.

Next, as indicated in FIG. 1E, projection electrodes 12a and 12b made of, for example, soldering balls are formed on the outer lead 10b and the conductor pattern 6, which are covered and protected by the insulating films 11a and 11b, while using these insulating films 11a and 11b as masks. These projection electrodes 12a and 12b are formed in a similar manner to that of the first embodiment mode.

Figure 12A:
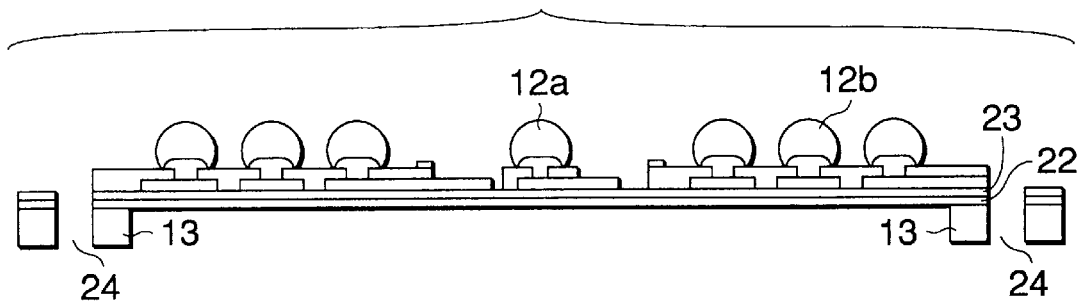
FIG. 12 is a manufacturing step diagram (No. 2) of the semiconductor package according to the second embodiment.

Subsequently, as shown in FIG. 12A, the copper board 21 of the metal base 20 is removed by way of the selective etching method while leaving a portion of the outer shape ring 13 inside the slit 24. When this selective etching method is carried out, the aluminum film 22 may function as an etching stopper, and thus only the copper board 21 is removed.

Figure 12B:
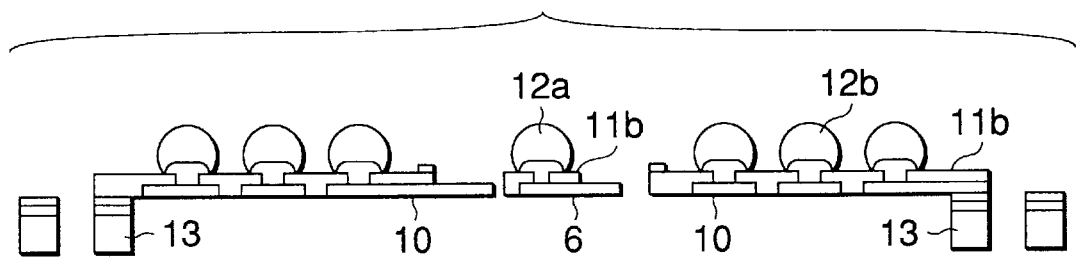

Next, as indicated in FIG. 12B, after the aluminum film 22 of the metal base 20 is removed by way of the selective etching method, the nickel film 23 is further removed by way of the selective etching method, so that the respective leads 10 are isolated from each other. It should be noted that under the condition shown in FIG. 12B, this condition represents that the insulating film 11b provided on the outer side is separated from the insulating film 11a provided on the inner side. In an actual case, both the insulting film 11a and the insulating film 11b are coupled to each other by employing a suspend portion (not shown) formed in an integral body.

Figure 12C:
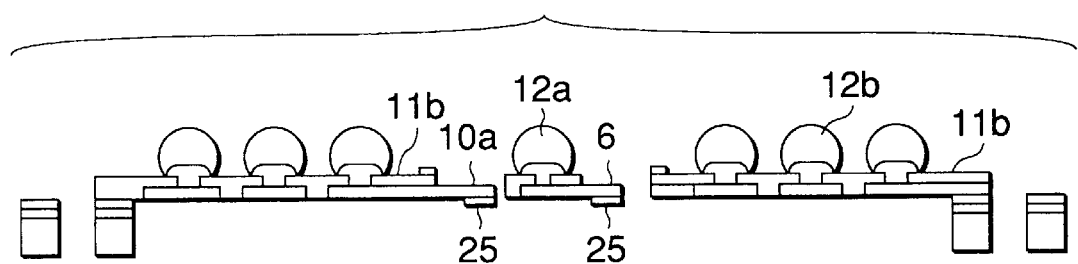

Next, as represented in FIG. 12C, a bump 25 made of aluminum by way of, for example, either the sputtering method or the vapor deposition method is formed on a tip portion of each of the inner leads 10a extended from the insulating film 11b and of the conductor pattern 6 projected from the insulating film 11a.

Figure 12D:
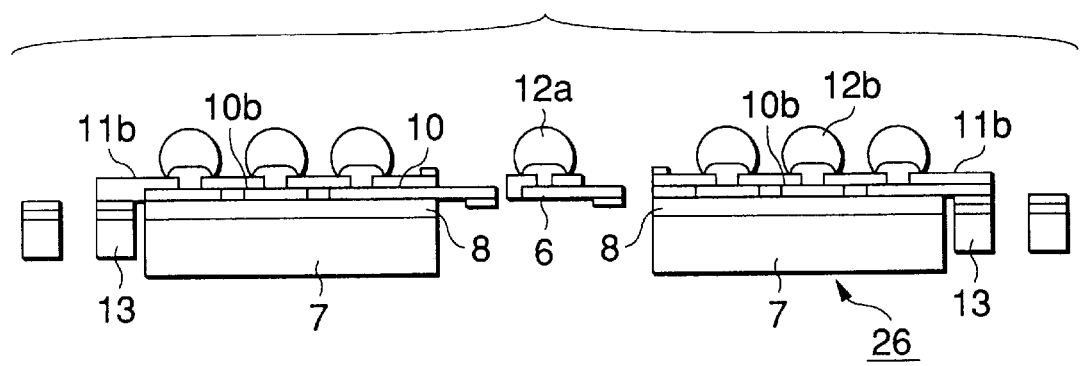

Thereafter, as shown in FIG. 12D, the reinforcement plate 7 is joined via the insulating adhesive layer 8 to the surface of the outer lead 10b protected by the insulating film 11b. When this reinforcement plate 7 is joined. Thus, the lead frame 26 before the semiconductor chip is assembled thereon is accomplished with employment of the above-described manner.

Figure 13A:
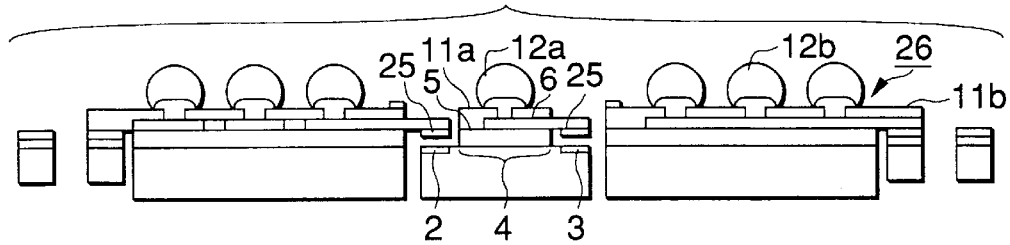
FIG. 13 is a manufacturing step diagram (No. 3) of the semiconductor package according to the second embodiment.

Subsequently, as indicated in FIG. 13A, when the semiconductor chip is assembled, while the position operation is carried out between the lead frame 26 and the semiconductor chip 2, the semiconductor chip 2 is joined (dye-bonded) via the adhesive layer 5 to the insulating film hla provided at the chip bonding region thereof. As a result, such a condition is made up. That is, the conductor pattern 6 is formed via the adhesive layer 5 on the effective element region 4 of the semiconductor chip 2, and the insulating film 11a is stacked on this conductor pattern 6. Also, the tip portions (bumps 25) of the inner leads 10a are positioned opposite to the corresponding electrode pads 3 of the semiconductor chip 2, respectively. At the same time, the tip portion (bump 25) of the conductor pattern 6 are positioned opposite to the corresponding electrode pad 3 of the semiconductor chip 2.

Figure 13B:
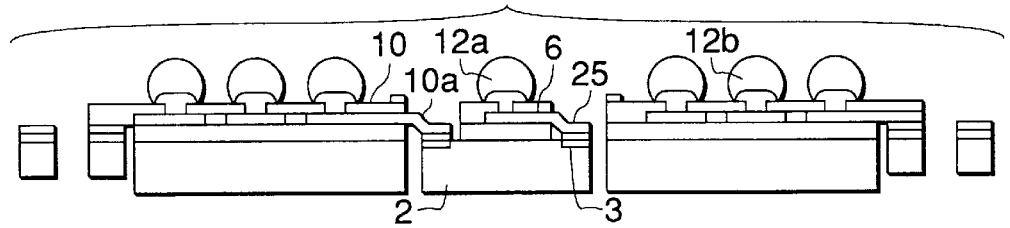

Next, as indicated in FIG. 13B, the tip portions of the respective inner leads 10a and also of the conductor pattern 6 are connected via the bumps 25 to the electrode pads 3 by way of the single point bonding, respectively. At this time, with respect to a plurality of electrode pads 3 formed on the semiconductor chip 2, the tip portion of the conductor pattern 6 may be arbitrarily connected to any one of these electrode pads 3 by changing the pattern shapes of the conductor pattern 6 and the lead 10.

Figure 13C:
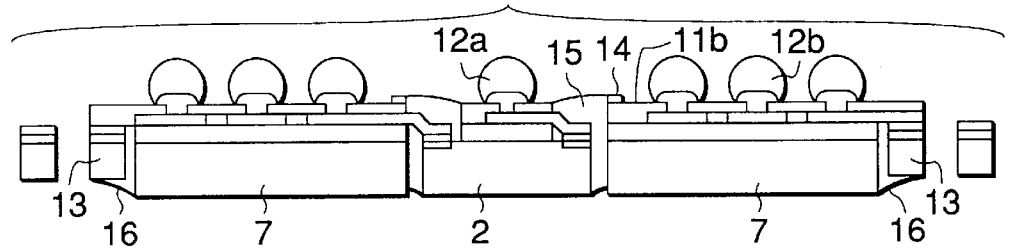

Next, as shown in FIG. 13C, the sealing resin 15 such as epoxy resin and silicone resin is injected into the peripheral region of the semiconductor chip 2 by way of the potting method, and then this sealing resin 15 is hardened, so that the peripheral components are made in an integral form. Furthermore, the conductor paste 16 such as silver paste and copper paste is filled into the space between the reinforcement plate 7 and the outer shape ring 13, and then this conductor paste is hardened so as to make both the reinforcement plate 7 and the outer shape ring 13 is an integral form.

Figure 13D:
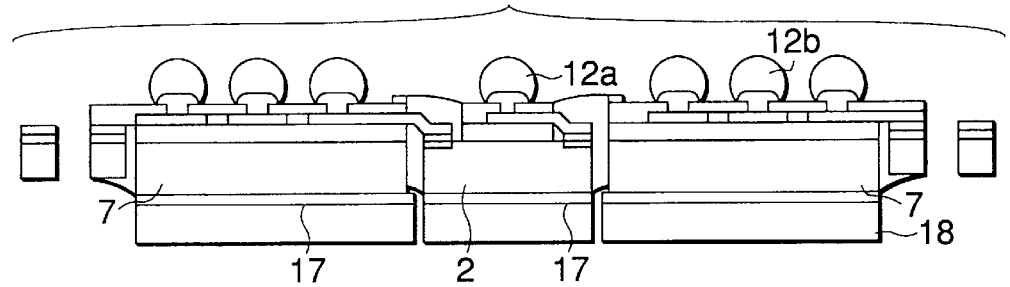
Figure 13E:
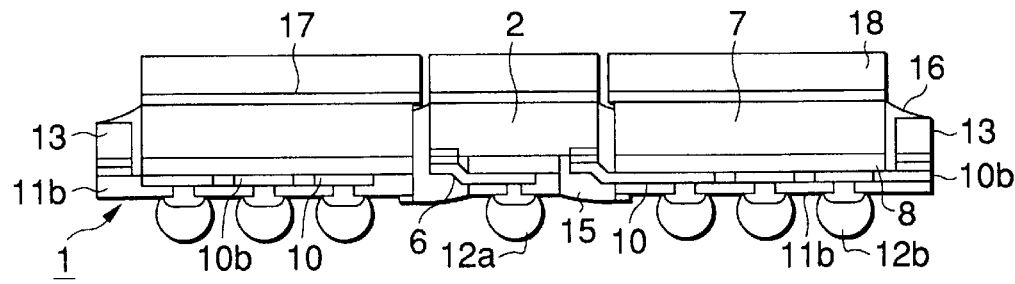

Next, as illustrated in FIG. 13D, the heat radiation plate 18 is joined via the heat conductive adhesive agent 17 to both the rear surface of the semiconductor chip 2 and the reinforcement plate 7. Moreover, as shown in FIG. 13E, unnecessary portions are cut out while setting the outer peripheral edge of the outer shape ring 13 as the boundary, so that the semiconductor package 1 indicated in FIG. 10 can be completed.

In accordance with the semiconductor package 1 of this second embodiment mode, a similar effect to that of the above-explained first embodiment mode can be apparently achieved. In particular, since the conductor pattern 6 is formed in the lead shape on the effective element region 4 of the semiconductor chip 2 and then the tip portion of this lead-shaped pattern is connected to the electrode pad 3 of the semiconductor chip 2, the connection path defined from the projection electrode 12a on the semiconductor chip 2 to the electrode pad 3 can be made shorter than the connection path defined from the projection electrode 12b formed on the reinforcement plate 7 to the electrode pad 3. In comparison with the previously explained package structure shown in FIG. 2, as a consequence, the shortest connection path defined from the projection electrode up to the electrode pad can be shortened, so that the inductance of the signal line can be lowered. Therefore, since such a signal line having a high speed priority requirement is allocated to the signal lines between the projection electrode 12a formed on the chip and the electrode pad 3 corresponding thereto, the electric characteristic can be improved. Furthermore, since the projection electrode 12a formed on the semiconductor chip 2 is utilized as the common portion of either the power supply or the ground, the electric characteristic can be furthermore improved.

In addition, since the region on the effective element region 4 of the semiconductor chip 2 is effectively utilized as the region for newly forming the electrode, the resultant electrode forming region can be made wider than that of the prior art. As a consequence, the semiconductor package 1 can be made with the structure having ultra-number of pins, and also can be reduced.

It should also be noted that in the above-described first and second embodiment modes, the outer shape ring 13 is provided outside the reinforcement plate 7, and thus the package outer shape is formed by this outer shape ring 13. The present invention is not limited to this structure, but may be similarly applied to the following package structure. For instance, as in the package structure shown in FIG. 10, the outermost peripheral portion of the reinforcement plate may directly constitute the package outer shape.

Also, as to a total number of the projection electrodes 12a formed on the semiconductor chip 2 and the arranging form thereof may be arbitrarily changed based on a relationship between the size of the electrode thereof (soldering ball etc.) and the outer diameter of the chip.

Figure 14:
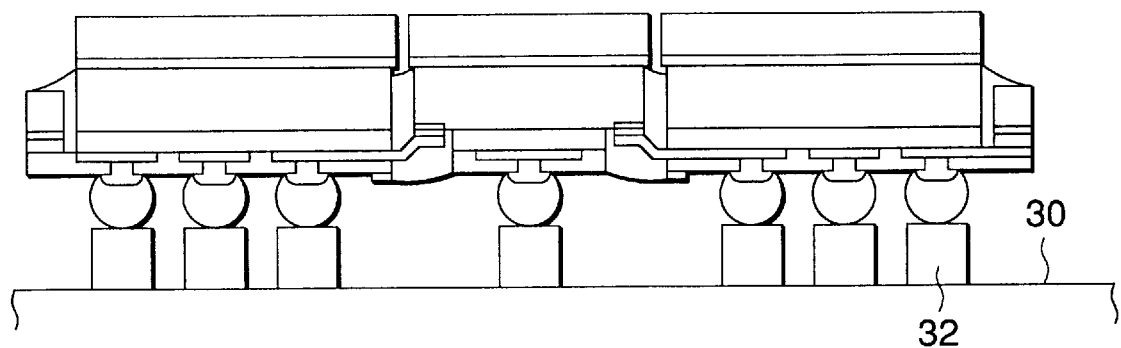
FIG. 14 illustratively shows an electronic appliance on which the semiconductor device, or the semiconductor package according to the present invention is mounted.
Figure 15:
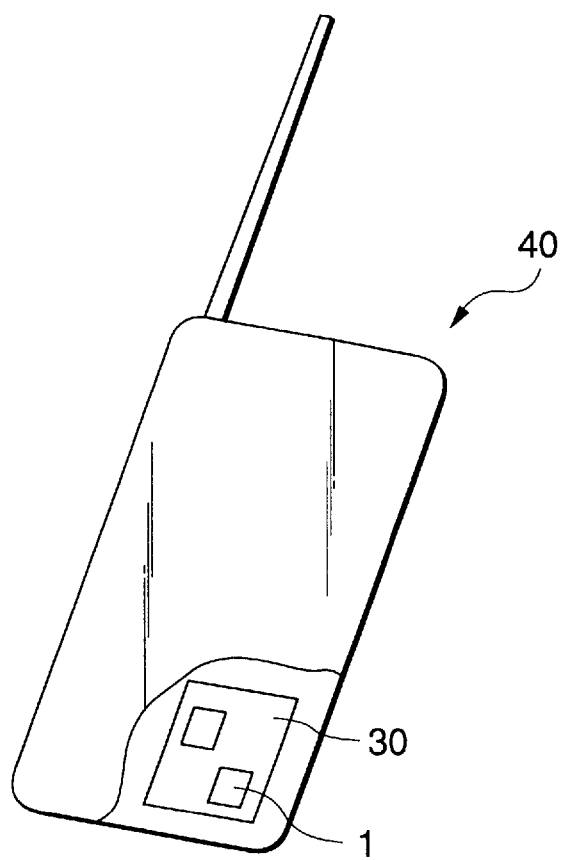
FIG. 15 is a cross-sectional view for schematically representing an internal circuit of the electronic appliance indicated in FIG. 14.

As represented in FIG. 14, each of the semiconductor device, or package 1 according to the first and second embodiment modes is mounted on a circuit board 30 in such a manner that the projection electrodes 12a and 12b (see FIG. 6 and FIG. 10) are connected to a plurality of electrodes 32 on the circuit board 30. Furthermore, as indicated in FIG. 15, such a circuit board 30 on which the above-described semiconductor device 1 constitutes at least a portion of an internal circuit of an electronic appliance, for example, a portable telephone 40, which requires compact components and also higher heat radiation characteristics. As a consequence, it is possible to manufacture the electronic appliance having high reliability with employment of the compact semiconductor device having the sufficient heat radiation effects.

As previously explained, in accordance with the present invention, the conductor pattern is formed on the effective element region of the semiconductor chip, and the projection electrodes are formed on this conductor pattern. As a consequence, when the semiconductor package is mounted on the packaging board, heat produced from the semiconductor chip can be directly dissipated via the projection electrodes to the packaging board. As a result, it is possible to provide in future, such a semiconductor package having a sufficiently high heat radiation characteristic. Also, since the projection electrodes are provided on the reinforcement plate and the semiconductor chip, when the projection electrodes such as the soldering balls are formed by way of the electrolytic plating method, the fluctuation in the sizes of the soldering balls can be suppressed. Accordingly, the uniformed size of the balls can be realized.

What is claimed is:

1. A semiconductor device comprising:
   a semiconductor chip in which a plurality of electrode pads are formed on a peripheral portion of a surface of the semiconductor chip, and an inside of a pad forming region thereof is used as an effective element region;
   a reinforcement plate which surrounds the semiconductor chip;
   a plurality of leads constituted by an outer lead portion which is covered by an insulating film to be protected on the reinforcement plate, and an inner lead portion which extends from the outer lead portion in an integral form, in which a projection electrode is provided on said outer lead portion and a tip portion of said inner lead portion is connected to the electrode pad of said semiconductor chip;
   a conductive outer shape ring surrounding the reinforcement plate;
   a conductive paste between the outer shape ring and the reinforcement plate;
   sealing resin filed into a peripheral region of said semiconductor chip;
   a heat conductive plate secured to a rear surface of said semiconductor chip opposite said active element region; and
   gas discharge holes operatively positioned in said heat conductive plate to allow sealing resin gases to be communicated out from said semiconductor device, wherein:
   a conductor pattern is formed on the effective element region of said semiconductor chip;
   said conductor pattern is covered by an insulating film to be protected;
   a further projection electrode provided on the conductor pattern; and
   one of said plurality of outer lead portions extends to the conductive paste such that an electrical interconnection exists between the outer shape ring and the extended outer lead portion.

2. A semiconductor device as claimed in claim 1 wherein:
   said conductor pattern is formed in a lead shape; a tip portion of this lead-shaped pattern is formed under such a condition that said tip portion is projected from said insulating film; and also a tip portion of this projected pattern is connected to the electrode pad of said semiconductor chip.

3. An electronic appliance comprising:
   a circuit board having a plurality of electrodes; and
   a semiconductor device including a semiconductor chip in which a plurality of electrode pads are formed on a peripheral portion of a surface of the semiconductor chip, and an inside of a pad forming region thereof is used as an effective element region;
   a reinforcement plate which surrounds the semiconductor chip;
   a plurality of leads constituted by an outer lead portion which is covered by an insulating film to be protected on the reinforcement plate, and an inner lead portion which extends form from the outer lead portion in an integral form, in which a projection electrode is provided on said outer lead portion and a tip portion of said inner lead portion is connected to the electrode pad of said semiconductor chip;
   a conductive outer shape ring surrounding the reinforcement plate;
   a conductive paste between the outer shape ring and the reinforcement plate;
   sealing resin filed into a peripheral region of said semiconductor chip;
   a heat conductive plate secured to a rear surface of said semiconductor chip opposite said active element region; and
   gas discharge holes operatively positioned in said heat conductive plate to allow sealing resin gases to be communicated out from said semiconductor device, in which:
   a conductor pattern is formed on the effective element region of said semiconductor chip;
   said conductor pattern is covered by an insulating film to be protected;
   a further projection electrode provided on the conductor pattern; and
   one of said plurality of outer lead portions extends to the conductive paste such that an electrical interconnection exists between the outer shape ring and the extended outer lead portion;
   wherein:
   said semiconductor device is connected to said plural electrodes on said circuit board by said projection electrode.

4. An electronic appliance as claimed in claim 3 wherein:
   said conductor pattern is formed in a lead shape; a tip portion of this lead-shaped pattern is formed under such a condition that said tip portion is projected from said insulating film; and also a tip portion of this projected pattern is connected to the electrode pad of said semiconductor chip.

* * * * *